United States Patent
Jiruse et al.

(10) Patent No.: US 10,535,496 B2
(45) Date of Patent: Jan. 14, 2020

(54) DEVICE WITH ION COLUMN AND SCANNING ELECTRON MICROSCOPE

(71) Applicant: TESCAN Brno, s.r.o., Brno (CZ)

(72) Inventors: Jaroslav Jiruse, Blansko (CZ); Filip Lopour, Brno (CZ)

(73) Assignee: TESCAN Brno, s.r.o., Brno (CZ)

( * ) Notice: Subject to any disclaimer, the term of this patent is extended or adjusted under 35 U.S.C. 154(b) by 0 days.

(21) Appl. No.: 16/133,107

(22) Filed: Sep. 17, 2018

(65) Prior Publication Data

US 2019/0088445 A1    Mar. 21, 2019

(30) Foreign Application Priority Data

Sep. 20, 2017   (CZ) .................................. 2017-566

(51) Int. Cl.
*H01J 37/05*   (2006.01)
*H01J 37/20*   (2006.01)
*H01J 37/21*   (2006.01)
*H01J 37/28*   (2006.01)
*H01J 37/244*   (2006.01)

(52) U.S. Cl.
CPC ............ *H01J 37/244* (2013.01); *H01J 37/05* (2013.01); *H01J 37/20* (2013.01); *H01J 37/21* (2013.01); *H01J 37/28* (2013.01); *H01J 2237/20207* (2013.01); *H01J 2237/24475* (2013.01); *H01J 2237/31745* (2013.01); *H01J 2237/31749* (2013.01)

(58) Field of Classification Search
CPC .......... H01J 37/244; H01J 37/05; H01J 37/20; H01J 37/21; H01J 37/28; H01J 2237/20207; H01J 2237/24475; H01J 2237/31749

USPC .................. 250/306, 307, 309, 310, 311
See application file for complete search history.

(56) References Cited

U.S. PATENT DOCUMENTS

| | | |
|---|---|---|
| 5,387,793 A | 2/1995 | Sato et al. |
| 5,578,822 A | 11/1996 | Van Der Mast et al. |
| 6,600,156 B2 | 7/2003 | Kazumori |
| 7,105,843 B1 | 9/2006 | Pearl |
| 7,425,701 B2 | 9/2008 | Steigerwald et al. |
| 2006/0076489 A1 | 4/2006 | Ohshima |
| 2011/0248164 A1 | 10/2011 | Straw |
| 2012/0261573 A1 | 10/2012 | Adamec |
| 2013/0328246 A1 | 12/2013 | Wells |
| 2014/0361167 A1 | 12/2014 | Morishita et al. |
| 2015/0348751 A1 | 12/2015 | Brogden |

FOREIGN PATENT DOCUMENTS

| | | |
|---|---|---|
| CZ | 298912 | 3/2008 |
| EP | 2674742 | 12/2003 |

OTHER PUBLICATIONS

Zeiss, Zeiss Crossbeam family—Your FIB-SEM for High Throughput 3D Analysis and Sample Preparation, Version 2.0, Mar. 14, 2017.

(Continued)

*Primary Examiner* — Nicole M Ippolito
*Assistant Examiner* — Hanway Chang
(74) *Attorney, Agent, or Firm* — Thedford I. Hitaffer; Hitaffer & Hitaffer, PLLC

(57) ABSTRACT

A device with an ion column and a scanning electron microscope comprises at least one column detector of signal electrons placed inside or on the ion column. Signal generated on the sample is detected on the column detector during landing of a broad beam generated by the scanning electron microscope on the sample surface.

12 Claims, 3 Drawing Sheets

(56) References Cited

OTHER PUBLICATIONS

Industrial Property Office of the Czech Republic, Search Report dated Mar. 19, 2017, in CZ Application No. PV 2017-566, related to U.S. Appl. No. 16/133,107, filed Sep. 17, 2018.
European Patent Office, European Search Report dated Mar. 14, 2019, in EP Application No. 18195473.6, related to U.S. Appl. No. 16/133,107, filed Sep. 17, 2018.

DEVICE WITH ION COLUMN AND SCANNING ELECTRON MICROSCOPE

CROSS-REFERENCE TO RELATED APPLICATIONS

This application claims priority from CZ Patent Application No. CZ 2017-566, filed Sep. 20, 2017, the disclosure of which is incorporated herein by reference.

FIELD OF THE INVENTION

The present invention relates to signal detection in a device with an ion column and a scanning electron microscope.

BACKGROUND OF THE INVENTION

In the existing combined systems having ion columns (FIB) and electron columns (SEM) the space near the sample is very limited, since, apart from electron and ion columns, detectors for different types of signals, such as secondary electron detectors (SE), backscattered electron detectors (BSE), secondary ion detectors (SI), cathodoluminescence detectors (CL), Auger electron detectors, X-ray analyzers, such as energy dispersion spectroscope (EDS), wavelength-dispersive spectroscope (WDS), and analyzers of electron backscatter diffraction (EBSD) are installed in the vacuum chamber. Combined systems may potentially include optical microscopes, laser beams, scanning probe microscopes (e.g., atomic force microscopy AFM), gas injection systems (GIS), sample heating and cooling, manipulators, and other equipment. Usually, the closer the mentioned analyzers are to the sample, the better is the collection angle, and the optimum signal is often perpendicular to the sample, resulting in a "fight for space" and many compromises made when designing more complex devices provided with a large number of detectors and analyzers.

Further limitation of space above the sample occurs in relation to a requirement for the shortest working distance (i.e., a distance between the column pole tip and the sample). For example, the shorter working distance of electron microscopes, the better the resolution; therefore, the working distance is 1 mm for imaging and 5-15 mm for analysis is usually used. Similarly, when working with higher pressure in the chamber than in the column, for example in environmental microscopy, the shortest possible working distance is required in order to maintain the quality of a primary electron beam during its travel through higher pressure in the chamber.

The above mentioned factors result in a lack of space for placing the signal detectors. In particular, the conventional detector BSE, which is usually concentric around the electron column optical axis with the width of more than 10 mm and closely above the sample practically prevents using other necessary detectors or considerably reduces the effectiveness of collecting the other signals. A typical solution is a BSE detector retractable from a side (i.e., perpendicular to the electron column optical axis), and is retracted when not collecting a signal. However, it is often necessary to read signals simultaneously from several detectors including the BSE. Furthermore, the conventional BSE detector limits the sample tilt required for example for working using a FIB device, when the sample needs to be tilted perpendicular to the ion column axis. In order to allow such tilt of the sample, the detector area is often cut, or eventually the grooves are cut, or holes for other detectors and analyzers are drilled. However, this results in a smaller detection area, lower quality of detected signal and broken detection symmetry (i.e., homogeneity of the signal).

A wide range of technological solutions protected by patents try to deal with the mentioned spatial problems concerning the signal detection. Based on the U.S. Pat. No. 5,387,793, an SE detector is placed above the objective lens in electron microscope, wherein using additional electrodes creating crossed magnetic and electrostatic fields (also known as E×B or so-called Wien filter) which point SE to the SE detector, not affecting the primary electron beam. Based on the U.S. Pat. No. 5,578,822, the device combines a conventional lens with an immersion single-pole lens arranged below. A secondary electron detector is placed in between of these lenses. Other solutions, such as U.S. Pat. No. 6,600,156 and CZ 298912, move the SE detector into the electron column in the area of the objective lens, where holes are drilled from a side to detect signal electrons.

The mentioned solutions demand space in the electron column. In addition, the mentioned drilling in the objective lens causes problems with column sealing for environmental microscopy and problems related to weakening of the material in the magnetic circuit. Weakening of the material leads to magnetic saturation and undesirable extension of magnetic field to the optical axis. Moreover, installation of other elements creating crossed E×B fields occupies further precious space in the electron column. Therefore, some other necessary elements, such as scanning coils, are limited. In addition, current trends include SEM systems with number of different detectors to collect different signals emitted from the sample under different angles. For example, preferred configuration of the electron microscope comprises a single BSE detector arranged closer to the sample, which collects high-angle signal electrons, and another BSE detector further from the sample, which collects signal electrons closer to the electron column. In a structure of an electron column with two or three BSE detectors and further two or three SE detectors, the space in the electron column is unacceptably over-filled.

In case of electron columns with an inserted isolated tube on high positive potential, see e.g. U.S. Pat. No. 7,425,701 or US 2014/0361167, the need to integrate SE and BSE detectors into electron column leads to special solutions which are complicated in terms of structure. For example, the solution for detection in a combined system on page 5 of ZEISS Crossbeam Family document, Your FIB-SEM for High Throughput 3D Analysis and Sample Preparation, 14 Mar. 2017, https://applications.zeiss.com/C125792900358A3F/0/FCB253FF6416DBE8C1257BD00048BC58/$FILE/EN_42_011_091_Crossbeam_rel2_0.pdf with an electron column with a potential tube is based on a placement of signal electron detectors inside the electrostatic field from the potential tube. Both SE detector and BSE detector are arranged therein. In general, adding another detector into the electron column is complicated in such systems and, as a consequence, the structure of the whole electron column is changed.

By combining the requirements for a large number of devices in the chamber in close vicinity to the sample, the shortest working distance possible, and problematic arrangement of detectors directly into the electron column, results in a problem with suitable placement of the signal electron detectors. Furthermore, in combined FIB-SEM systems, in contrast to a stand-alone SEM, there is an option to detect secondary ions (SI) and ion-induced secondary electrons (ISE). When working with ion beam in a combined FIB-SEM system, the sample is usually tilted perpendicularly to the FIB column. Ion and electron column in these devices usually form 40-70° or 90° angle, and thus the detectors placed in the electron column collect only a part of the signal traveling under relatively high angle from the perpendicular line to the surface of the sample. However, the highest signal concentration is along the perpendicular line towards the surface of the sample, therefore, only a small part of the signal is detected.

SUMMARY OF THE INVENTION

The mentioned drawbacks are eliminated by the present invention related to detecting signal from the sample. The device uses a combination of scanning electron microscope and ion column that are connected to vacuum chamber. The ion column has an ion source on one end and a pole tip on the other end. By the pole tip we mean end of the pole piece regardless of whether it is actually an area or an apex. The first signal electron detector in the column is arranged between the ion source and the pole tip. The ion column may be of a type with focused or broad ion beam. The ion column axis forms an optional angle with the electron column axis, usually 40-70°, but it may also be an angle of 90°, or in case of a broad ion beam the axes may be skew lines.

The invention is characterized in that the first column detector is placed inside the ion column. This column detector is used for collecting a signal from electrons generated during landing of a primary electron beam from a scanning electron microscope onto the sample. The signal can be detected even in case the primary electron beam from a scanning electron microscope lands on the sample surface simultaneously with the primary ion beam from the ion column. In addition, during work with a focused ion beam in a combined FIB-SEM system, the sample is usually tilted perpendicularly to the ion column axis. With this sample position and scanning by the electron column, the column detector in the ion column receives a larger amount of signal than a corresponding detector in the electron column.

It is possible to replace or complement other detectors with the column detector. By replacing a corresponding detector in the electron column or in the vacuum chamber we obtain more free space for other devices. In case we add the column detector into the system, we have a chance to collect and process the signal from more detectors at the same time. The first column detector is placed inside the ion column between the ion source and the pole tip.

In a preferred embodiment, the stage for sample placement is adjusted for the sample tilt so that it is possible to keep the sample surface perpendicular to the electron column axis or perpendicular to the ion column axis. Furthermore, the stage can be adjusted for application of electric voltage source (hereinafter referred to as voltage), or possibly, voltage may be applied directly onto the sample. The applied voltage may be either positive or negative depending on various applications of the device.

Furthermore, a second column detector may be placed between the ion source and the pole tip. The first and the second column may be even adapted to detect signal electrons having different energies, which may be achieved by adding an electrode of a preferred shape and applying preferred voltage thereon. The system may be designed so that the signal electrons are either detected on the first column detector or on the second column detector (optionally not detected at all) depending on their energy and angular distribution and the limit may be optionally adjusted.

A detector may be installed at the pole tip on the bottom part of the ion column at the place where the ion column opens up. The detector may also be placed outside the ion column on the pole piece.

The column detector, the second column detector, the pole tip detector and the pole piece detector may be designed as detector of secondary electrons or backscattered electrons. The shape of the column detector may be concentric around the ion column axis or it may be placed on the side of the ion column, for example perpendicular to the ion column axis. The detection area of the detectors may be compact or divided into several segments detecting separately. The signals from individual segments may be combined, added or subtracted, etc. All known types of detection may be used, for example, the use of a scintillating crystal or semi-conductor type of detector, etc.

In addition, the device according to the present invention may comprise a filtration electrode connected to the voltage source. The filtration electrode is arranged near the ion column pole tip, for example, concentrically around the ion column axis between the pole tip and the sample, or from a side in between the pole tip and the sample, or on the pole piece of the ion column, and it may be in a shape of an electrode or a grid. The filtration electrode attracts or repels signal electrons emitted from the sample surface towards the pole tip detector or towards the column detector. The polarity and magnitude of voltage applied to the filtration electrode depends on the energy of the signal electrons which are to be detected on the particular detector.

Furthermore, the device may be complemented with a directional electrode arranged in the vacuum chamber. Suitable voltage may be applied on the directional electrode so that its electrostatic field pushes the emitted charged particles towards the column detectors placed inside the ion column, or towards the pole tip detector, or towards the pole piece detector.

LIST OF DRAWINGS OF EXEMPLARY EMBODIMENTS

EXAMPLES OF EXEMPLARY EMBODIMENTS

Figure 1:
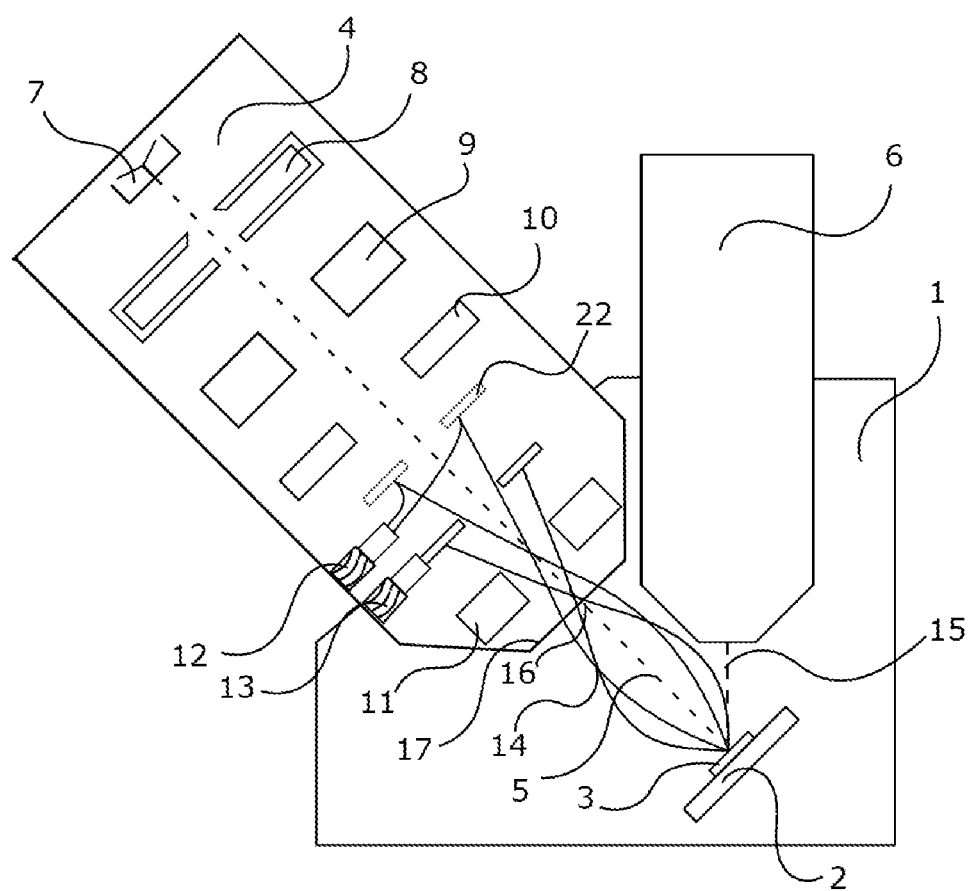
FIG. 1 shows a schematic representation of a device with electron column detectors integrated inside an ion column and a scanning electron microscope.

FIG. 1 shows an example of a device according to the present invention. It illustrates a vacuum chamber 1, in which a stage 2 is arranged for placing a sample 3 adapted for its tilt. Furthermore, the device comprises an electron column 6 and an ion column 4. The ion column 4 is designed as a column forming a focused primary ion beam 5, which comprises a ion source 7 placed on one end of the ion column 4, behind which an extractor 8, a condenser lens 9, a deflector 10, a conversion area 22, the first column detector 12, the second column detector 13 and an objective lens 11 are arranged on the other end of the ion column 4. The ion column 4 is terminated with a pole piece 17 and a pole tip 16. The first column detector 12 and the second column detector 13 are formed as detectors of signal electrons 14.

The ion column 4 forms a primary ion beam 5. It may be used for observation of the sample 3, sample 3 milling, or deposition of any material on the sample 3. The primary ion beam 5 is formed by an extractor 8 and a condenser lens 9, subsequently deflected by a deflector 10 and focused by an objective lens 11. The primary ion beam 5 further travels through the pole tip 16 and hits the surface of the sample 3. The sample 3 is tilted through the stage 2 perpendicularly to the ion column 4. Sample 3 interacts with the hitting primary ion beam 5 and the material of the sample 3 is sputtered. The course of sputtering is best to be observed by an electron microscope. Sample 3 is scanned by a primary electron beam 15 generated in the electron column 6. The highest amount of signal electrons 14 follows a trajectory perpendicular to the sample 3, i.e. near the axis of the ion column 4. These signal electrons 14 further travel through the pole tip 16 to the first column detector 12 and to the second column detector 13, where they are detected. Both detectors may be of various known shapes and types. For example, the first column detector 12 is designed as a conversion type detector, wherein on the conversion area 22 after landing of signal electrons 14 conversion electrons are emitted, which are further drawn by positive voltage on the first column detector 12. The second column detector 13 is designed as a scintillating electron detector, wherein signal electrons 14 are first converted into a light and then into an electrical signal. The scintillating detector comprises a conductively coated scintillator (for example YAG type), a light guide, and a photomultiplier. Other known types of detectors may also be used, for example solid state detector, multi-channel plate or direct electron pixelated detector etc. During simultaneous scanning by a primary ion beam 5 and a primary electron beam 15 BSE signal may be used, which is formed through scanning by the primary electron beam 15 and is not interfered by other signals generated from the sample 3.

In some cases, it is preferred to interrupt the work of the ion column 4 and create an image of the sample 3, using exclusively the primary electron beam 15. Neither in this case it is necessary to change the tilt of stage 2, which is preferred, since the inaccuracy from the sample 3 is not brought to observation. The generated signal electrons 14 again follow the direction perpendicular to the surface of the sample 3, i.e. towards ion column 4, therefore, the signal may be detected by the first column detector 12 or by the second column detector 13, wherein this type of signal detection is more preferred than using a standard column detector or a detector in the ion column 6.

In other cases, it is possible to apply potential to the stage 2 for placement of the sample 3 or eventually directly to the sample 3 in the range from single volts up to tens of kV in both polarities for working in other imaging modes. For example, connecting potential of +50 V to the stage 2 prevents detection of secondary electrons, since secondary electrons have energy <50 eV and the positive surface of the sample 3 pulls them back to the sample 3. Respective detectors then detect signal just from back-scattered electrons with energy of >50 eV without any additional secondary electrons. In another example, potential of −1000 V is applied to the sample 3, which increases the energy of signal electrons 14 by 1000 eV and the electrons are accelerated in the direction perpendicular to the surface of the sample 3, i.e. towards the first column detector 12 or the second column detector 13.

Experts skilled in the art will appreciate that alternatively it is possible to use a scintillating detector of a different configuration or a detector of any other type, for example a solid state detector, multi-channel plate or direct electron pixelated detector etc. The first column detector 12 and the second column detector 13 may be configured differently in the ion column 4 or they can be complemented with other detectors. It is possible to use other types of ion columns which comprise other parts, or potentially do not comprise some of the mentioned parts. Similar potential may be applied to the sample 3 or the stage 2, either in the position of the sample 3 perpendicular to the axis of the ion column 4, or perpendicular to the axis of the electron column 6, as well as different arbitrary tilt of the stage 2.

Figure 2:
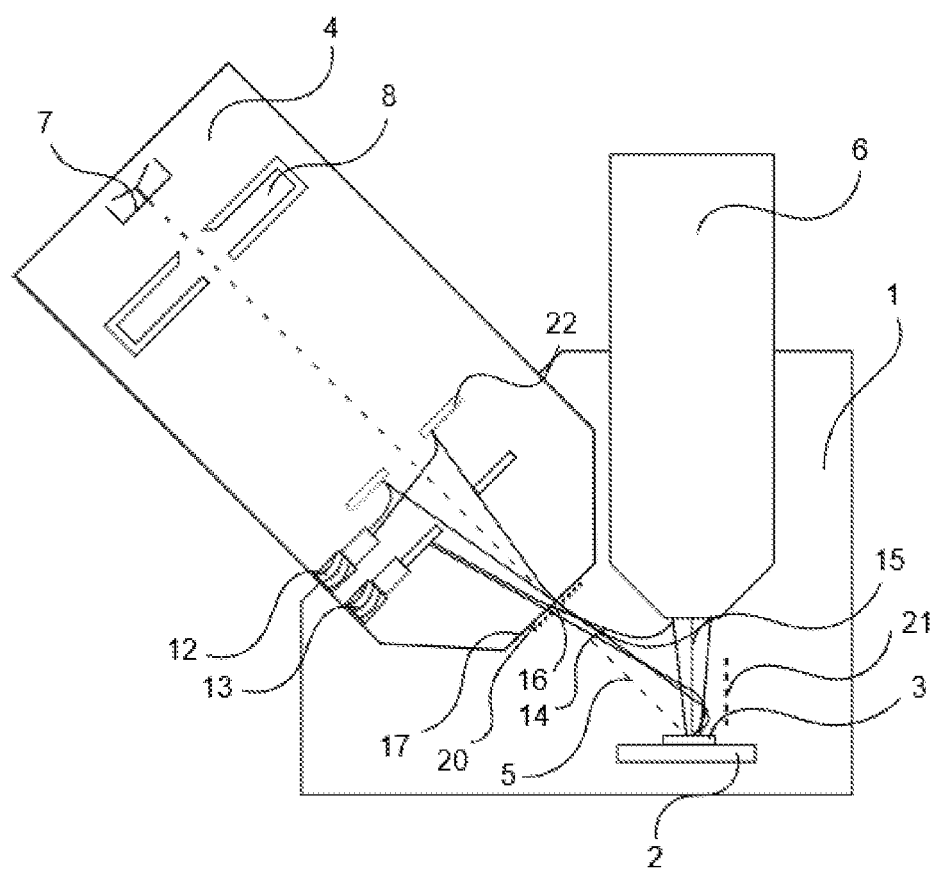
FIG. 2 shows a schematic representation of a device with electron column detectors integrated inside an ion column having a scanning electron microscope, directional electrode, and filtration electrode.

FIG. 2 shows a schematic representation of a similar device with the difference that the ion column 4 is designed as a column generating a broad primary ion beam 5. The device is complemented with a filtration electrode 20 arranged in front of the aperture at the ion column pole tip 16 and a directional electrode 21 arranged in the vacuum chamber 1 parallel to the axis of the electron column 6. The filtration electrode 20 is connected to the source of positive potential and the directional electrode 21 is connected to the source of negative potential. The stage 2 is tilted so that the surface of the sample 3 points perpendicularly to the ion column 6.

Upon landing of the primary electron beam 15 from the electron column 6 or the primary ion beam 5 from the ion column 4 (or potentially both), signal electrons 14 (for example, SE and BSE) are generated from the sample 3. In this case, these electrons travel perpendicularly from the surface of the sample 3, towards the electron column 6. Signal electrons 14 emitted from the sample 3 are then deflected by a directional electrode 21 to the ion column pole tip 16. A filtration electrode 20 arranged in front of the aperture in the pole tip 16 of the ion column 4, which is connected to the source of positive voltage, attracts signal electrons 14 and guides them to the pole tip 16, where they are detected by the first column detector 12 or by the second column detector 13.

Potential applied to the filtration electrode 20 may be either positive or negative, depending on whether the filtration electrode 20 fulfills filtration function or just attracting function. For example, if negative potential −1000 V is applied to the filtration electrode 20, then only electrons or negative ions with energy higher than 1000 eV pass through the filtration electrode 20 and are detected in the ion column 4, while signal electrons 12 with energy lower than 1000 eV, i.e. for example, secondary electrons, are deflected by the filtration electrode 20 and remain undetected.

Experts skilled in the art will appreciate that it is possible to use a number of differently arranged or shaped filtration electrodes 20 and directional electrodes 21 or even use other devices suitably placed in the ion column 4, such as for example other detectors, and to use their electrostatic or magnetic fields.

Figure 3:
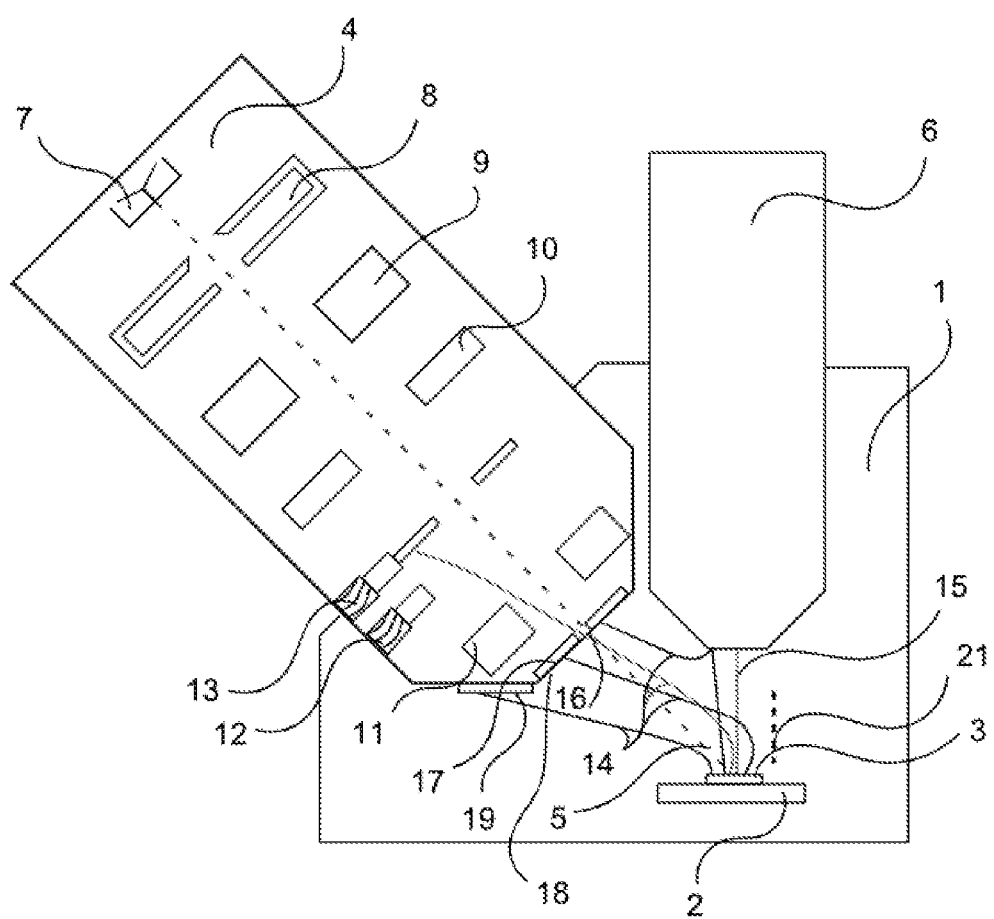
FIG. 3 shows a schematic representation of a device comprising two column detectors, a pole tip detector and pole piece detector.

FIG. 3 illustrates a representation of embodiment in which an ion column 4 generating a focused primary ion beam 5 and an electron column 6 is connected to the vacuum chamber, similarly to the FIG. 1. In the vacuum chamber 1, a stage 2 for placement of the sample 3 is arranged, which is adapted for tilting the sample 3. Inside the ion column 4, the column detector 12 is arranged from a side and the second column detector 13 is arranged concentrically around the axis of the ion column 4. The device further comprises a pole tip detector 18 and a pole piece detector 19, which are complemented with a directional electrode 21 placed in the vacuum chamber 1. The directional electrode 21 is connected to the source of negative potential. In this embodiment, the pole tip detector 18 is an annular detector of electrons and is arranged around the aperture in the pole tip 16. The pole piece detector 19 is also formed as an electron detector.

Stage 2 is tilted so that the sample 3 is perpendicular to the ion column 6. During scanning of the sample 3 by a primary electron beam 15 signal electrons 14 are generated from the sample 3, and using an electrostatic field of the directional electrode 21, which travel towards the first column detector 12, the second column detector 13, the pole tip detector 18, and the pole piece detector 19. In order to improve detecting, negative voltage is applied to the directional electrode 21, which bends the trajectory of signal electrons 14 emitted from the sample. The degree of trajectory bending depends on the angle under which a signal electron 14 moves out of the sample and on its energy. The choice of voltage applied to the directional electrode 21 depends on a geometric configuration, so that the signal detected by the particular detectors is increased. The applied voltage may range between single volts and kV. Based on the magnitude of voltage on the directional electrode 21 and on other factors, some signal electrons 14 get inside the ion column and are detected by some of the column detectors, and in case the signal electrons 14 run further from the axis of the ion column, they are detected by the pole tip detector. If signal electrons are deflected further, they are collected by the pole piece detector. Therefore, higher effectiveness of detecting of the device is reached.

Electron column 6, illustrated in the drawings only by its outline, may be of any shape, for example, having a conventional or immersion objective lens, more objective lenses, a tube on potential, or others. The electron column 6 generally comprises a source of the primary electron beam 15, at least one condenser lens, at least one objective lens, which may be electromagnetic, electrostatic, and/or combination thereof; furthermore, the electron column 6 comprises deflection coils and stigmator coils for correction of astigmatism. Any number of various types of detectors may be placed in the electron column 6, for example, SE detectors, BSE detectors, transmission electron detectors, EDS/WDS detectors, EBSD detectors. The said detectors may be placed in different parts of the ion column 6 and may be embodied according to the known state of the art.

LIST OF REFERENCE SIGNS

1—vacuum chamber
2—stage
3—sample
4—ion column
5—primary ion beam
6—electron column
7—ion source
8—extractor
9—condenser lens
10—deflector
11—objective lens
12—first column detector
13—second column detector
14—signal electrons
15—primary electron beam
16—pole tip
17—pole piece
18—pole tip detector
19—pole piece detector
20—filtration electrode
21—directional electrode

The invention claimed is:

1. A device with an ion column and an electron column comprising a vacuum chamber having a stage, on which a sample is placed, an electron column and the ion column are connected to the vacuum chamber, wherein the ion column has an ion source on one of its sides and a pole piece ended with a pole tip on the other side, wherein between the ion source and a pole tip at least a first column detector is arranged, embodied as a detector of signal electrons from which at least a portion are back-scattered electrons.

2. The device with an ion column and an electron column according to claim 1 wherein the first column detector is placed inside the ion column.

3. The device with an ion column and an electron column according to claim 1 the wherein the ion column is adjusted for forming a focused primary ion beam.

4. The device with an ion column and an electron column according to claim 1 wherein that the stage is adjusted for tilting the sample.

5. The device with an ion column and an electron column according to claim 1 wherein the stage or the sample is connected to voltage source.

6. The device with an ion column and an electron column according to claim 1 wherein in between the ion source and the pole tip an additional second column detector is arranged, embodied as a detector of signal electrons.

7. The device with an ion column and an electron column according to claim 6 wherein the first column detector and the second column detector are adjusted for detection of signal electrons with various energies.

8. The device with an ion column and an electron column according to claim 1 wherein the device further comprises a pole tip detector on the pole tip.

9. The device with an ion column and an electron column according to claim 1 wherein the device further comprises a pole piece detector on the pole piece.

10. The device with an ion column and an electron column according to claim 1 wherein at least one detector from the following group of the first column detector, the second column detector a pole tip detector, and a pole piece detector is embodied as a detector of backscattered electrons.

11. The device with an ion column and an electron column according to claim 10 wherein a filtration electrode connected to the voltage source is arranged in the vacuum chamber near the pole tip of the ion column.

12. The device with an ion column and an electron column according to claim 10 wherein a directional electrode connected to the voltage source is arranged in the vacuum chamber.

* * * * *